United States Patent [19]
Mydill et al.

[11] Patent Number: 5,151,903
[45] Date of Patent: Sep. 29, 1992

[54] HIGH EFFICIENCY PATTERN SEQUENCE CONTROLLER FOR AUTOMATIC TEST EQUIPMENT

[75] Inventors: Marc R. Mydill; Sheila O'Keefe, both of Garland, Tex.

[73] Assignee: Texas Instruments Incorporated, Dallas, Tex.

[21] Appl. No.: 414,050

[22] Filed: Sep. 28, 1989

[51] Int. Cl.⁵ .......................... G06F 11/00; G06F 9/40
[52] U.S. Cl. ........................................................ 371/27
[58] Field of Search ............................................ 371/27

[56] References Cited

U.S. PATENT DOCUMENTS

| | | | |
|---|---|---|---|
| 4,682,330 | 7/1987 | Millham | 371/27 X |
| 4,792,892 | 12/1988 | Mary et al. | 364/200 |
| 4,797,886 | 1/1989 | Imada | 371/27 |

*Primary Examiner*—Stephen M. Baker
*Attorney, Agent, or Firm*—B. Peter Barndt; Richard L. Donaldson

[57] ABSTRACT

A pattern sequence control system utilizing a control RAM to provide pattern control information only when a change in pattern sequence control is required, thereby significantly reducing the amount of pattern control memory required. The pattern sequence control system utilizes a single pattern address counter for sequential patterns and a single loop address counter for looping pattern. The pattern address counter and loop address counter provide the pattern memory address for all pattern memory regardless of the number of tester channels. A cycle counter determines the number of test cycles that a sequential pattern or repeating pattern will be applied. A loop length counter and loop counter are used to control pattern looping.

12 Claims, 1 Drawing Sheet

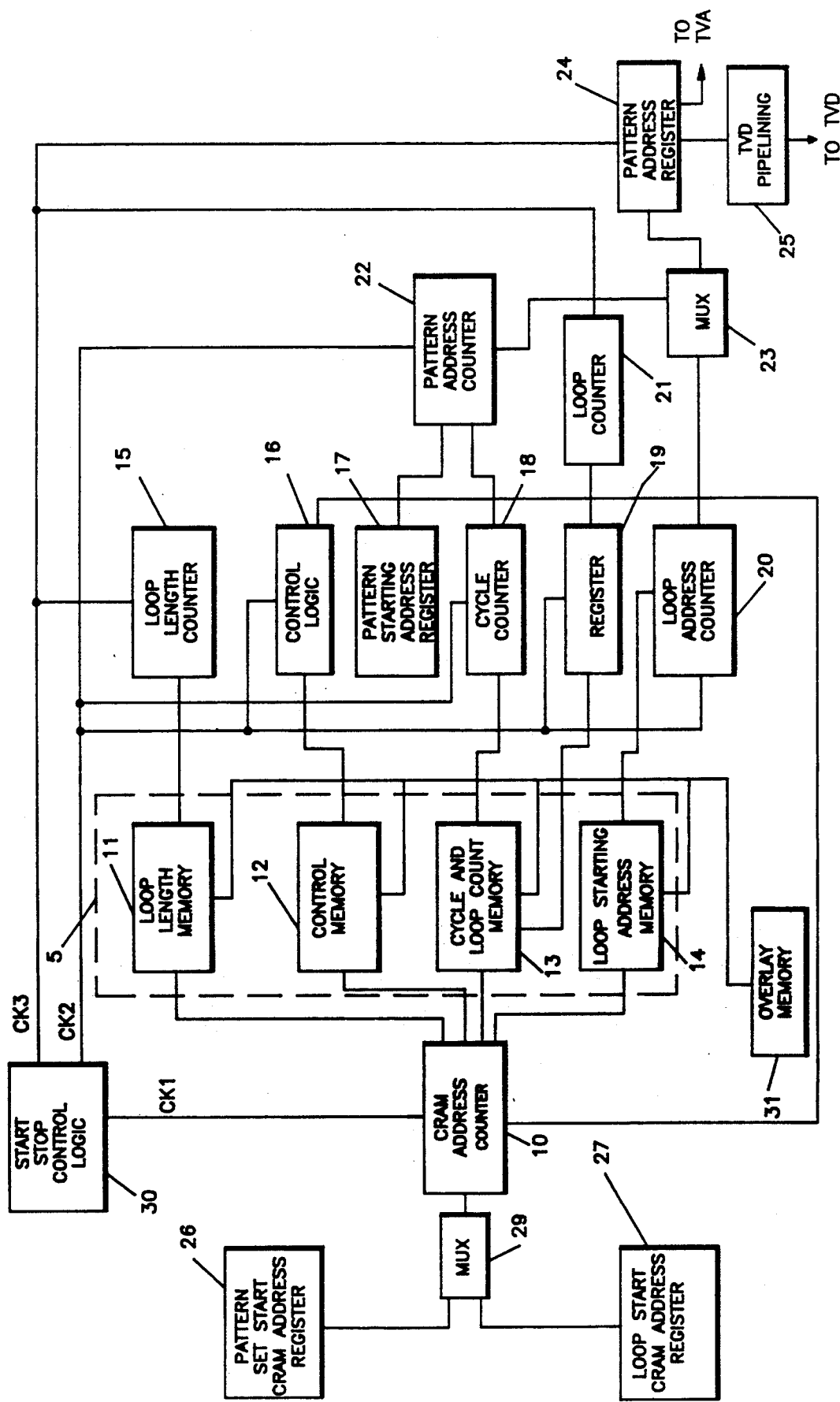

HIGH EFFICIENCY PATTERN SEQUENCE CONTROLLER FOR AUTOMATIC TEST EQUIPMENT

FIELD OF THE INVENTION

This invention relates to test systems for semiconductor devices, and more particularly to a pattern sequence controller for use in such systems.

BACKGROUND OF THE INVENTION

Conventional pattern sequence controllers used in present logic test systems provide a control code for every pattern in a test pattern set. Due to the nature of test patterns, this control code is typically highly redundant, for example, a typical test pattern set is comprised almost entirely of sequential or "straight line" patterns. This means that the test pattern addresses are sequential. Limited pattern compression is sometimes achieved by using a pattern control code to repeat individual patterns or loop on groups of patterns. The use of a control code for every pattern, as provided in prior art testers, is very inefficient.

BRIEF DESCRIPTION OF THE INVENTION

The present invention uses a control ram (CRAM) based pattern sequence controller to store control codes that describe the changes in pattern control, resulting in a significant compression of pattern control storage as well as a simplification of the pattern control hardware. Large patterns sets can be controlled efficiently and at higher speed during pattern execution.

A control RAM (CRAM) provides pattern control information. The Control Ram Address is changed only when a change in pattern control is required, i.e.,there is not an update for every pattern as there is in prior art systems. The basic pattern control supported by the CRAM is straight line (sequential) patterns, repeating patterns, and pattern loops.

Operation bits or Op bits are used for various control functions. A pattern address counter increments a pattern address for sequential pattern sequences. The Op bits "freeze" or hold the counter for a repeating pattern and during pattern loops. A cycle counter determines the number of test cycles that a sequential pattern or repeating pattern will be applied.

Pattern loops are performed by; loading a loop count into a loop counter, loading the loop length into a loop length counter, loading the starting address of the loop into a loop address counter, freezing the pattern address counter, and selecting the output of the loop address counter to be sent to the pattern memory. The loop address counter is incremented every test cycle during a loop, and the loop counter is incremented at the beginning of the loop, each time through the loop. The loop length counter is incremented wherever the CRAM address changes during the loop. If at the end of the loop, the loop count is not complete, the CRAM address counter is reloaded with the starting CRAM address of the loop. There are provisions for the pattern sequence controller to exit a loop before the loop count is complete for conditional or "match" loops. When a loop is complete, the pattern address counter continues operation at the next sequential pattern address from where it left off. The pattern sequence controller can start execution from any pattern address.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 1 is diagram of the pattern sequence controller of the present invention.

DESCRIPTION OF A PREFERRED EMBODIMENT

The invention is a PSC (Pattern Sequence Control) system which controls the sequence of pattern memory addresses applied to pattern memory boards during the execution of a functional test. The design is based on the use of a control ram (CRAM) to store control information describing only the changes in the sequence that patterns are executed. This results in a significant compression of pattern control storage, as well as a simplified design that allows large pattern sets to be controlled efficiently, and executed quickly, up to 100MHZ.

FIG. 1 is a diagram of the Pattern Sequence controller of the present invention.

Programming of the pattern sequence controller is effected by a series of bits which are defined as follows.

CRAM BIT DEFINITIONS

D47 - D32: COUNT15 - COUNT0. These 16 COUNT bits contain either the cycle count or the loop count. The cycle count represents either the number of sequential pattern addresses to be executed in a "straight line" mode or the number of times a single pattern is to be repeated. The loop count represents either the number of times an unconditional loop is to be executed or the maximum number of times a match loop may be executed before logging a failure.

D31: LONE. The LONE (loop of one) bit is high when executing a loop with only two CRAM locations, the second of which represents only one pattern cycle, i.e. the ONE bit is set in the second CRAM location of the loop. This is needed to reload the CRAM address register in time during 100MHz operation.

D30: SEL. The SEL (select) bit is high whenever a loop is executing. The SEL bit selects the loop address counter to drive the pattern memory address (PMA) lines rather than the pattern address counter. The SEL bit is also sent on to the pattern memory boards in order to freeze the "straight line" memory and force execution from the loop memory.

D29: SEL*. This is always the compliment of SEL. This is required in order to support 100MHZ operation, since there is not enough time for the hardware to invert SEL.

D28: FILL*. The FILL* bit is low whenever fill vectors are being executed to await the pass/fail information in match loops.

D27 - D16: START11 - START0. The 12 START bits contain the starting address in loop memory for a pattern loop.

D15: RPT*. The RPT* (repeat*) bit is low whenever a pattern is to be repeated COUNT times.

D14: EXIT. The EXIT bit is high on the last pattern of a pattern set.

D13: PREBEG*. The PREBEG* (pre-begin*) bit is low on the first CRAM instruction of a loop.

D12: ONE. The ONE bit is high whenever a CRAM instruction represents only one pattern cycle. This is required to increment the CRAM address register in time during l00MHZ operation.

D11 - D0: LEN11 - LEN0. The 12 LEN (length) bits represent the number of CRAM instructions contained in a loop.

FIG. 1 is a diagram of the Pattern Sequence Controller and includes the Control RAM (CRAM). CRAM 5 is comprised of the loop length memory 11, control memory 12, cycle and loop count memory 13 and loop starting address memory 14. The CRAM memory is effectively a 4096×48 bit memory. The CRAM address is changed only when a change in pattern control is required. The basic pattern control supported by this system is: (1) Straight line (sequential) patterns; (2) Repeating patterns; and (3) Pattern loops.

The starting pattern is determined by the contents of the Start CRAM Address Register 26 and Pattern Starting Address Register 17.

The control memory outputs (RPT*, EXIT, PRBEG*, ONE, LONE, SEL, SEL*, FILL*) are used for various control functions. The pattern address counter 22 increments the 23 bit pattern address for sequential pattern execution. This is the address used by the straight line memory on the pattern memory boards.

The RPT* bit causes this counter to freeze during a repeating pattern. The cycle counter 18 determines the number of test cycles a sequential sequence or repeating pattern will be applied.

Pattern loops are performed by loading the output of the cycle and loop count memory 13 into the loop counter 21 (after a one cycle delay via register 19), loading the output of the loop length memory 11 into the loop length counter 15, loading the output of the loop starting address memory 14 into the loop address counter 20, freezing the pattern address counter 22, and selecting the output of the loop address counter 20 via the pattern address multiplexer 23 to the start of the pattern memory address pipeline 25. The CRAM address corresponding to the start of the loop is saved in the Loop Start CRAM Address Register 27 at the beginning of the loop. This address is loaded into the CRAM counter at the beginning of each iteration of the loop via 29.

The loop address counter 20 is incremented every test cycle (except for repeating patterns) during the loop. The loop length counter 15 is incremented whenever the CRAM address changes during the loop. The loop counter is incremented at the beginning of the loop (each time through the loop). The SEL bit is active during a loop. This is used to control the pattern address multiplexer 23 and is also eventually sent to the pattern memory boards to control pattern execution from loop (or fast) memory.

If, at the end of a loop, the loop count is not complete, the CRAM address counters are reloaded with the starting CRAM address of the loop (which is saved in 27 at the beginning of the loop). There are also provisions for the PSC to exit a loop before the loop count is complete (for match loops) via the loop condition code bit (LOOPCC). The loop condition code is enabled with the FILL* bit during fill vectors at the end of a match loop.

When a loop is complete, the pattern address counter 22 continues operation at the next sequential pattern address from where it left off (this is similar to a return from a subroutine).

The core of the PSC represents three pipeline stages. This is necessary to achieve 100MHZ performance. Because of the pipelining, the ONE, and LONE CRAM outputs provide "early warning" of test cycles that require "back to back" CRAM changes, via Control Logic 16. The three core pipeline stages are sequenced with CK1, CK2, and CK3. These are derived from the incoming PSC_TZ clock signal from the Master Oscillator. The Start/Stop logic 30 synchronizes the pattern start signal with the PSC_TZ.

The CRAM address counter 10 is duplicated 6 times in order to avoid inserting fanout circuitry in the CRAM address path. This eases 100MHZ operation. The CRAM output ONE must be fed back to the CRAM address counter control circuitry. In order to minimize the round trip delay and ensure 100MHZ operation, the CRAM address counter 10 for the control memory 12 is implemented in GaAs.

The pattern memory address is latched at the beginning of each test cycle in the pattern address register 24. The pattern address pipeline is used to delay pattern memory addresses sent to different types of pattern memory boards.

The CRAM overlay memory 31 is effectively a 32K×48 bit memory. Since the CRAM is 4K deep, this memory can store four CRAM overlays at one time.

What is claimed:

1. A pattern sequence control system for controlling the sequence of pattern memory addresses applied to pattern money during the execution of test cycles of functional tests for semiconductor devices, comprising;
   a memory for storing control information describing only changes in the sequence of a pattern that is to be executed;
   control logic circuits for incrementing the addresses of control information for pattern sequence changes;
   a single pattern address counter for incrementing the pattern addresses in memory for sequential patterns;
   a single loop address counter for incrementing the pattern address in memory for looping patterns; and
   a cycle and loop count memory storing a cycle count which represents the number of times a single pattern is to be repeated and a loop count which represents the number of times a loop is to be executed; wherein the cycle count also represents the number of sequential pattern addresses to be executed in a straight line mode, and the loop count represents the maximum number of times a match loop is to be executed before logging a failure.

2. The pattern sequence control system according to claim 1, including a loop length counter, used in conjunction with pattern loops, that is incremented whenever the pattern address changes during the loop, and is initialized at the start of each iteration through the loop.

3. The pattern sequence control system according to claim 1, including a control RAM which provides output to alert the control system of the need for test cycles that require back-to-back changes.

4. A pattern sequence control system for controlling the sequence of pattern memory addresses applied to pattern memory during the execution of a functional test, comprising;
   a control RAM for storing the changes in the sequence of patterns that are to be executed;

a single pattern address counter for incrementing the pattern addresses in memory for sequential patterns; and a single loop address counter for incrementing the pattern address in memory for looping patterns; and a cycle and loop count memory storing a cycle count which represents the number of times a single pattern is to be repeated and a loop count which represents the number of times a loop is to be executed;

wherein the cycle count also represents the number of sequential pattern addresses to be executed in a straight line mode, and the loop count represents the maximum number of times a match loop is to be executed before logging a failure.

5. The pattern sequence control system according to claim 4, wherein basic pattern control includes straight line sequential patterns, repeating patterns, and pattern loops, including;

at least one counter to determine the number of test cycles a sequential sequence or repeating pattern is to be applied, and at least one address register to store a pattern starting address.

6. The pattern sequence control system according to claim 4, including a loop counter which is incremented at the beginning of each loop as it is processed through the control system.

7. The pattern sequence control system according to claim 4, including a loop length counter, used in conjunction with pattern loops, that is incremented whenever the pattern address changes during the loop, and is initialized at the start of each iteration through the loop.

8. The pattern sequence control system according to claim 4, including a cycle counter which determines the number of test cycles a sequential sequence or repeating pattern will be applied.

9. A method of compression of pattern control storage and sequential patterns are to be performed during successive test cycles, comprising the steps of:

storing control information in a memory describing only the changes in the sequence of a pattern that is to be executed; and incrementing the memory address for pattern sequence changes;

loading a starting pattern address into a pattern address counter;

loading the output of the cycle count and loop count memory into a cycle counter; and incrementing the pattern address counter until the cycle counter has reached a terminal count;

wherein the cycle count also represents the number of sequential pattern addresses to be executed in a straight line mode, and the loop count represents the maximum number of times a match loop is to be executed before logging a failure.

10. The method according to claim 9, wherein pattern loops are to be performed on a sequence of patterns during successive test cycles, the pattern sequence addresses are generated by a loop address counter, including the steps of:

loading the output of the cycle and loop count memory into a loop counter;

loading the output of a loop length memory into a loop length counter;

loading the output of a loop starting address memory into a loop address counter;

freezing the pattern address counter; and selecting the output of the loop address counter via a pattern address multiplexer to start a pattern address pipeline.

11. The method according to claim 9, wherein information is stored for straight line patterns, repeating patterns and pattern loops.

12. The method according to claim 9, including loading a cycle count to determine the number of test cycles a repeating pattern will be applied.

* * * * *